United States Patent
Chu

(10) Patent No.: US 7,026,973 B2
(45) Date of Patent: Apr. 11, 2006

(54) ELECTRONIC DEVICE WITH MULTIPLE BUTTONS

(75) Inventor: Yao-Wen Chu, Taoyuan (TW)

(73) Assignee: Benq Corporation, Taoyuan (TW)

( * ) Notice: Subject to any disclaimer, the term of this patent is extended or adjusted under 35 U.S.C. 154(b) by 0 days.

(21) Appl. No.: 11/059,815

(22) Filed: Feb. 17, 2005

(65) Prior Publication Data

US 2005/0184900 A1   Aug. 25, 2005

(30) Foreign Application Priority Data

Feb. 19, 2004   (TW) ............................... 93104160 A

(51) Int. Cl.
*H03M 1/12* (2006.01)
(52) U.S. Cl. ........................................ 341/155; 341/154
(58) Field of Classification Search ................ 341/155, 341/154
See application file for complete search history.

(56) References Cited

U.S. PATENT DOCUMENTS 4,725,816 A * 2/1988 Petterson ...................... 341/24
5,087,871 A * 2/1992 Losel ........................... 361/90

* cited by examiner

*Primary Examiner*—John Nguyen
*Assistant Examiner*—Lam T. Mai
(74) *Attorney, Agent, or Firm*—Thomas, Kayden, Horstemeyer & Risley

(57) ABSTRACT

An electronic device with multiple buttons includes a first resistor combination, a second resistor combination, N buttons, and an output node. A first end of the first resistor combination is connected to a high voltage. A second end of the first resistor combination is connected to a third end of the second resistor combination. A fourth end of the second resistor combination is connected to a low voltage. The first resistor combination has p serially connected resistors, and the second resistor combination has q serially connected resistors. The sum of p and q equals M, a positive integer equal to or large than 3. Each button is connected in parallel with at least one resistor. The output node is deposited between the first and the second resistor combinations. The output node outputs an analog signal whose voltage corresponds to the states of the buttons.

13 Claims, 3 Drawing Sheets

ELECTRONIC DEVICE WITH MULTIPLE BUTTONS

This application claims the benefit of Taiwan application Serial No. 093104160, filed Feb. 19, 2004, the subject matter of which is incorporated herein by reference.

BACKGROUND OF THE INVENTION

1. Field of the Invention

The invention relates in general to an electronic device, and more particularly to an electronic device with multiple buttons.

2. Description of the Related Art

In a conventional electronic device, a common design of button circuit is to have buttons directly connected to pins of the microprocessor's general purpose input output (GPIO) for determining the state of buttons by the microprocessor directly.

Although such a button circuit design has the advantages of being direct and simple, a large number of GPIO pins will be required when more buttons are needed. Since each button uses a specific GPIO pin, and the microprocessor has a limited number of GPIO pins, such button circuit design is not suitable for an electronic device with a large number of buttons.

To save the use of the GPIO pins, an analog-to-digital converter (ADC) keypad is used. Referring to FIG. 1, a partial circuit diagram of a conventional electronic device with an ADC keypad is shown. In electronic device 10, the ADC keypad 20 includes a resistor combination 16, M buttons $SW_1$~$SW_M$, and an output node 30.

The resistor combination 16 has M+1 serially connected resistors $R_0$~$R_M$, and the two ends of the resistor combination 16 are respectively electrically connected with a high voltage Vcc and a grounding voltage. The two ends of each button are respectively electrically connected with the grounding voltage and the node between two adjacent resistors. The output node 30 is disposed between the resistor $R_0$ and the resistor $R_1$ for outputting an analog voltage. The analog voltage corresponds to the state of M buttons. The analog voltage of the output node 30 is converted to a corresponding digital signal via the ADC 50, and then the electronic device's microprocessor 60 further processes the digital signal to execute the function corresponding to the state of M buttons.

It can be seen from above that the ADC keypad 20 can use less GPIO pins by the I/O port of the ADC. Although the ADC keypad can use less GPIO pins of the microprocessor, the ADC keypad 20 does not have any multi-key function. For example, when buttons SW1 and SW2 are both pressed, the microprocessor 60 will determine that only the button SW1 has been pressed. Therefore, when the button of the electronic device needs to use more than two multi-keys, more ADC I/O ports will be needed. How to equip the electronic device with multi-key function without adding more ADC I/O ports has become an urgent aim to achieve.

SUMMARY OF THE INVENTION

It is therefore an object of the invention to provide an electronic device with multiple buttons, which not only uses less GPIO pins of a microprocessor, but also equips the electronic device with multi-key function by means of an ADC I/O port only.

The invention achieves the above-identified object by providing a an electronic device with multiple buttons including a first resistor combination, a second resistor combination, N buttons and an output node. The first resistor combination has a first end and a second end, and the second resistor combination has a third end and a fourth end. The first end of the first resistor combination and a high voltage are electrically connected. The second end of the first resistor combination is connected to the third end of the second resistor combination. The fourth end of the second resistor combination and a low voltage are electrically connected. Besides, the first resistor combination has p serially connected resistors, and the second resistor combination has q serially connected resistors. The sum of p and q equals M, a positive integer larger than or equal to 3. Each button is connected in parallel with at least one resistor. The output node is disposed between the first resistor combination and the second resistor combination. The output node outputs an analog signal whose voltage corresponds to the state of N buttons.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 1:
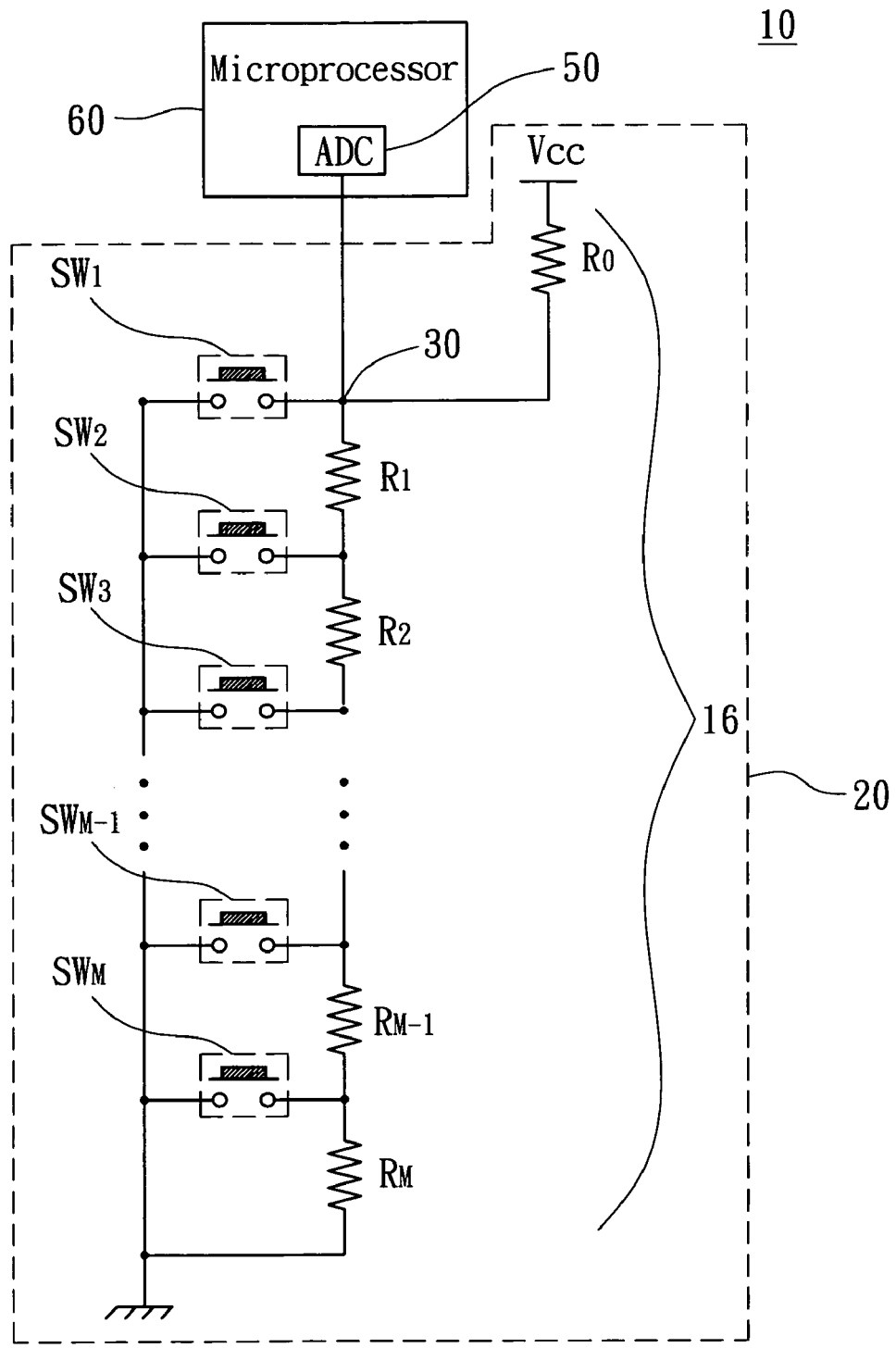
FIG. 1 is a partial circuit diagram of a conventional electronic device with an ADC keypad.
Figure 2:
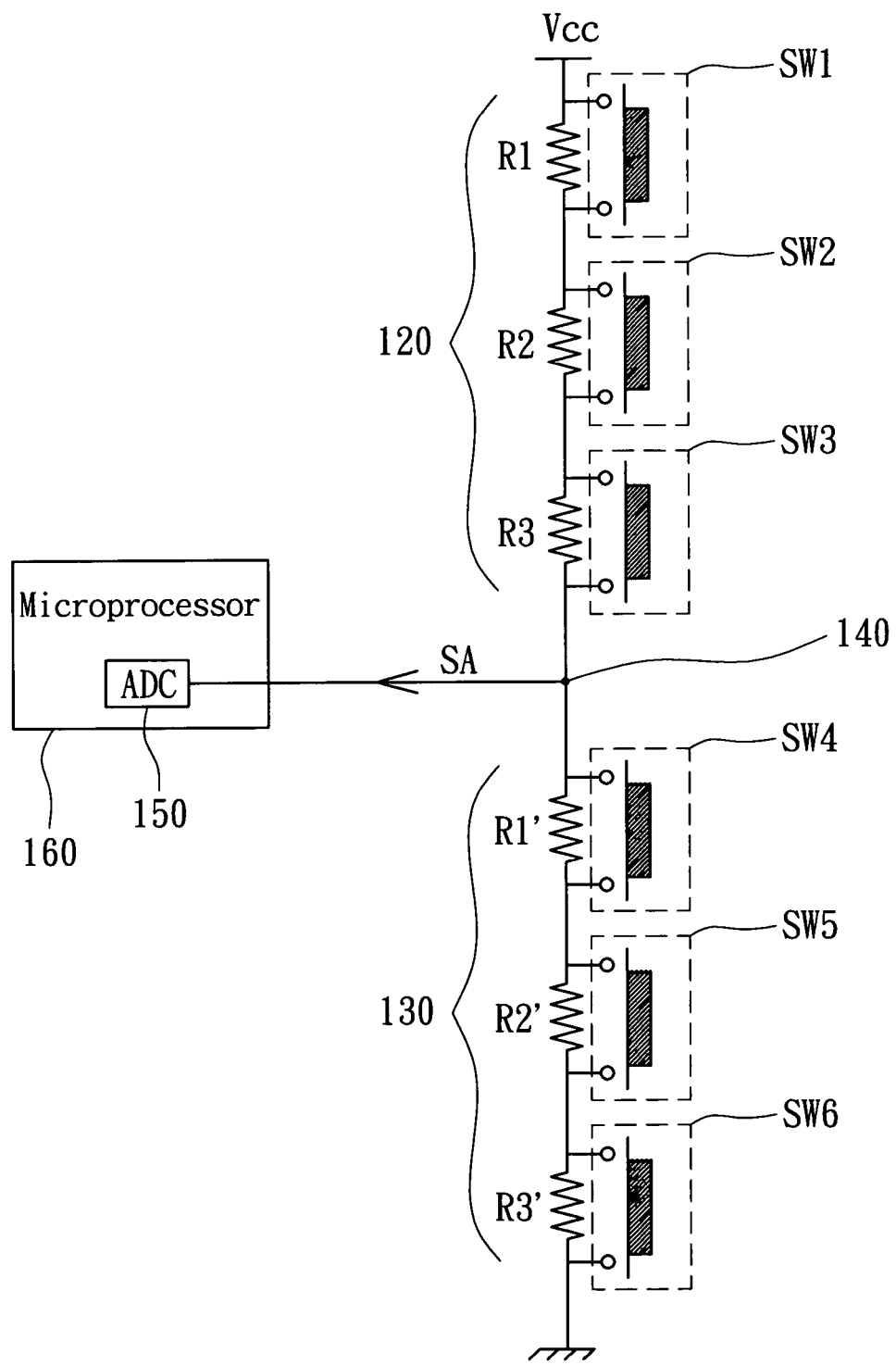
FIG. 2 is a partial circuit diagram of an electronic device with multiple buttons according to a first embodiment of the invention.

Referring to FIG. 2, a partial circuit diagram of an electronic device with multiple buttons according to a first embodiment of the invention is shown. Electronic device 100 includes a first resistor combination 120, a second resistor combination 130, 6 buttons SW1~SW6, an output node 140, an analog-to-digital converter (ADC) 150 and a microprocessor 160.

The first resistor combination 120 has 3 serially connected resistors R1~R3 with resistance R1~R3 respectively. The second resistor combination 130 also has 3 serially connected resistors R1', R2' and R3' with resistance R1', R2' and R3' respectively. One end of the first resistor combination 120 and a high voltage Vcc are electrically connected, while another end of the first combination 120 is connected to an end of the second resistor combination 130. Another end of the second resistor combination 130 and a grounding voltage are electrically connected.

Besides, the buttons SW1~SW6 are respectively connected in parallel with the resistors R1~R3 and the resistors R1'~R3'. The output node 140 is disposed between the first resistor combination 120 and the second resistor combination 130 for outputting an analog signal SA whose voltage corresponds to the state of buttons. The ADC 150 electrically connected with the output node 140 converts the analog signal SA into a digital signal, and then the electrically connected microprocessor 160 processes and executes the corresponding function of the state of buttons.

To further elaborate the relationship between the state of buttons and the voltage of the analog signal SA, the voltage of the output node 140 corresponding to the state of buttons are listed in Table 1 below, wherein the total resistance RT of the first resistor combination 120 is RT=R1+R2+R3, the total resistance RT' of the second resistor combination 130 is RT'=R1'+R2'+R3', and the voltage of the output node 140 is obtained according to circuit theory. It is noteworthy that the states of buttons listed in Table 1 are only part of the application of buttons in the first embodiment.

In Table 1, it can be seen that the voltage of the output node 140 generated when more than two buttons are pressed is different from the voltage of the output node 140 generated when only one button is pressed. Besides, the voltage of the output node 140 will vary with combinations of pressed buttons. The circuit design in the first embodiment enables buttons to have multi-key function, wherein the state of buttons can be reflected on the voltage of the output node 140. Therefore, according to the first embodiment, one single ADC I/O port will make the microprocessor 160 of the electronic device 100 determine what state of buttons is (whether only one or more buttons are pressed) so as to perform the function corresponding to the state of buttons.

Besides, it can also be seen from Table 1 that the voltage of the output node 140 is related with the state of buttons and the resistance of every resistor. To avoid the microprocessor 160 making an incorrect judgment, different state of buttons generating different voltage levels is necessary. The sum of any two resistance in each resistor combination is preferably not to be equal to of any remaining resistance. The first resistor combination 120 is exemplified in the following Table 1.

TABLE 1

Contrast Table Showing the Relationship between the State of Buttons and the Voltage of the Output Node 140 According to the First Embodiment

| The state of the buttons | The voltage of the output node 140 |
| --- | --- |
| Not press any button | Vcc*[RT'/(RT + RT')] |
| Press SW1 | Vcc*[RT'/(RT + RT' − R1)] |
| Press SW2 | Vcc*[RT'/(RT + RT' − R2)] |
| Press SW3 | Vcc*[RT'/(RT + RT' − R3)] |
| Press SW4 | Vcc*[(RT' − R1')/(RT + RT' − R1')] |
| Press SW5 | Vcc*[(RT' − R2')/(RT + RT' − R2')] |
| Press SW6 | Vcc*[(RT' − R3')/(RT + RT' − R3')] |
| Press SW1 + SW2 | Vcc*[RT'/(R3 + RT')] |
| Press SW2 + SW3 | Vcc*[RT'/(R1 + RT')] |
| Press SW1 + SW3 | Vcc*[RT'/(R2 + RT')] |
| Press SW1 + SW4 | Vcc*[(RT' − R1')/(RT + RT' − R1 − R1')] |
| Press SW5 + SW6 | Vcc*[RT'/(RT + R1')] |
| Press SW1 + SW2 + SW3 | Vcc |
| Press SW4 + SW5 + SW6 | 0 |

Please refer to FIG. 2 and Table 1. Setting all resistance of the first resistor combination in a geometric series would simplify the circuit design, and also meets the requirement that the sum of any two resistors should not be equal to another resistor. The ratio of the geometric series is preferably to be 2. For example, the resistances R1, R2 and R3 in the first resistor combination 120 can be set as 1:2:4. Hence, The voltage of the output node 140 will vary with the pressed button(s) (SW1, SW2, SW3, SW1+SW2, SW2+SW3 or SW1+SW3).

Similarly, if all resistance in the second resistor combination 130 form a geometric series relationship, the voltage of the output node 140 will vary with the pressed button(s) (SW4, SW5, SW6, SW4+SW5, SW5+SW6 or SW4+SW6).

If the resistances R1, R2, R3 are respectively equal to R1', R2', R3', then the voltage of the output node 140 will always be Vcc/2 when no button is pressed, or buttons SW1+SW4 are pressed. Similarly, the voltage of the output node 140 will be Vcc/2 when buttons SW2+SW5 or SW3+SW6 are pressed. When designing multi-key function, the two buttons respectively disposed in two resistor combinations and connected in parallel with the same resistance should not be considered.

In the first embodiment, the first resistor combination 120 and the second resistor combination 130 both have three resistors. However, according to the spirit of the invention, the resistor number of the first resistor combination 120 and of the second resistor combination 130 are neither necessarily to be 3, nor even be the same. As long as the sum of the resistors in the first resistor combination 120 and that in the second resistor combination 130 is larger than or equal to the positive integer 3, and both the first resistor combination 120 and the second resistor combination 130 include a resistor at least, multi-key function in the electronic device will be realized.

Besides, in the first embodiment, the amount of buttons is equal to the sum of resistors. However, according to the spirit of the invention, the amount of buttons is not necessarily equal to the sum of resistors, as long as each button is connected in parallel with at least one resistor. That is to say, the sum of resistors is larger than or equal to the amount of buttons.

Second Embodiment

Figure 3:
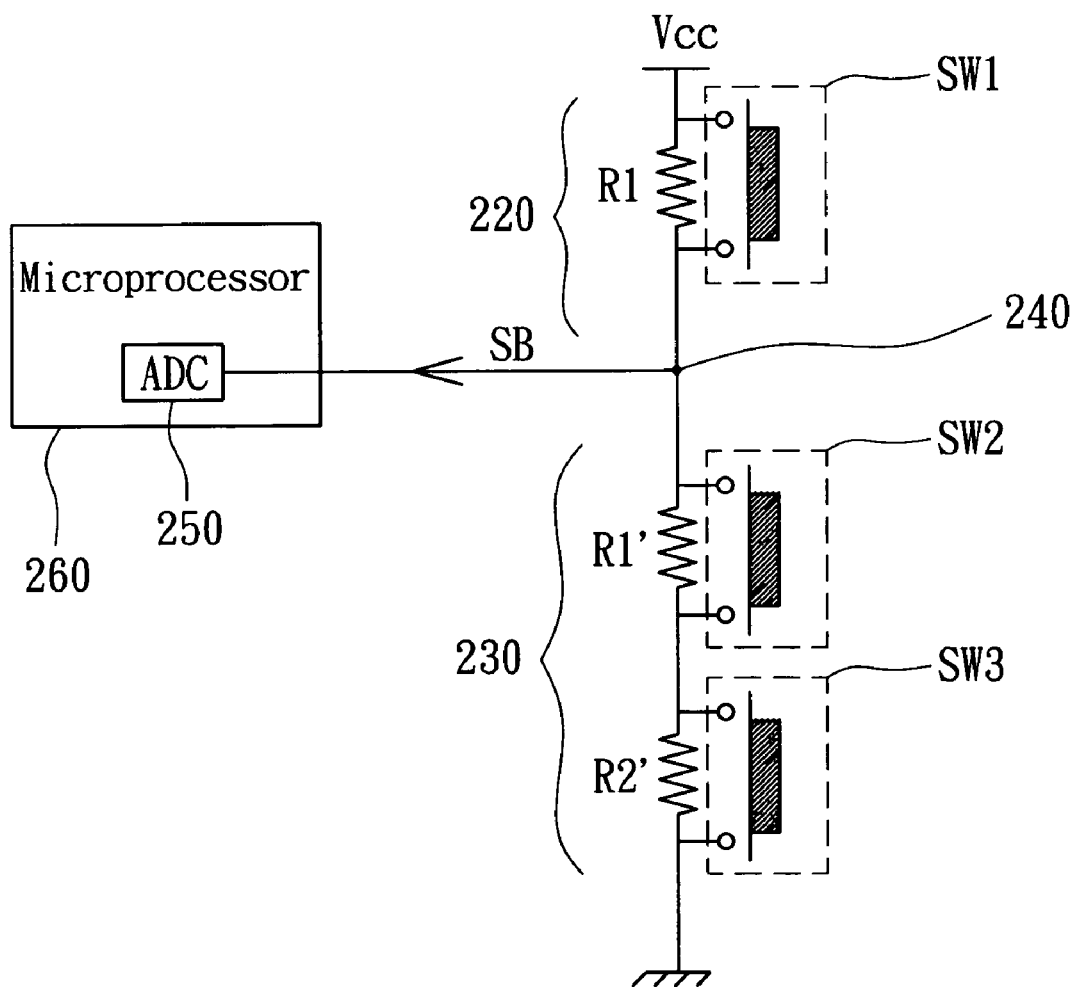
FIG. 3 is a partial circuit diagram of an electronic device with multiple buttons according to a second embodiment of the invention.

Referring to FIG. 3, a partial circuit diagram of an electronic device with multiple buttons according to a second embodiment of the invention is shown. The electronic device 200 includes a first resistor combination 220, a second resistor combination 230, three buttons SW1~SW3, an output node 240, an analog-to-digital converter 250 and a microprocessor 260.

The first resistor combination 220 includes a resistor R1 with the resistance R1. The second resistor combination 230 includes two serially connected resistors R1', R2' with resistances R1', R2' respectively. An end of the first resistor combination 220 and a high voltage Vcc are electrically connected, while another end of the first resistor combination 220 is connected to an end of the second resistor combination 230. Another end of the second resistor combination 230 and a grounding voltage are electrically connected.

Besides, the buttons SW1~SW3 are respectively connected in parallel with resistors R1, R1', and R2'. The voltage of output node 240 will vary with the pressed button(s) as shown in Table 2. The ADC 250 converts the analog signal SB into a digital signal for the microprocessor 260 of the electronic device 200 to process and execute the corresponding function of the state of buttons.

It is noteworthy that the states of buttons listed in Table 2 are only part of the application of buttons in the second embodiment. If the resistance R1' is not equal to the resistance R2', the voltage of the output node 240 when the button SW2 is pressed will differ with that when the button SW3 is pressed.

The difference between the second embodiment and the first embodiment is the number of the resistors in the two resistor combinations. It can be seen clearly from FIG. 2 that both the first resistor combination 120 and the second resistor combination 130 in the first embodiment have three resistors. That is to say, the design of the button circuit of the electronic device in the first embodiment is symmetric. It can also be seen clearly in FIG. 3 that in the second embodiment, the first resistor combination 220 only has a resistor and the second resistor combination 230 has two resistors. That is to say, the design of the button circuit of the electronic device in the second embodiment is asymmetric, and the resistors in the two resistor combinations add up to 3.

It can be understood from the above disclosure that no matter the design of the button circuit is symmetric or asymmetric, the multi-key function in the electronic device will be realized as long as the resistors of the two resistor combinations add up to be larger than or equal to 3.

TABLE 2

Contrast Table Showing the Relationship between the State of Buttons and the Voltage of the Output Node 240 According to the Second Embodiment

| The state of the buttons | The voltage of the output node 240 |
| --- | --- |
| Not press any button | Vcc*[(R1' + R2')/(R1 + R1' + R2')] |
| Press SW1 | Vcc |
| Press SW2 | Vcc*[R2'/(R1 + R2')] |
| Press SW3 | Vcc*[R1'/(R1 + R1')] |
| Press SW2 + SW3 | 0 |

Compared with a conventional electronic device, the design of the button circuit in the electronic device of the invention not only largely reduces the required GPIO pins of a microprocessor, but also accomplishes multi-key function of buttons in with an ADC I/O port only. Compared with a conventional electronic device which uses multiple ADC I/O ports, the electronic device of the invention has the advantages of reducing the material costs and reducing the electromagnetic interference.

While the invention has been described by way of example and in terms of the embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device with multiple buttons, comprising:
    a first resistor combination having p serially connected resistors, the first resistor combination having a first end and a second end, the first end being electrically connected to a high voltage;
    a second resistor combination having q serially connected resistors, the second resistor combination having a third end and a fourth end, the second end of the first resistor combination being connected to the third end of the second resistor combination, the fourth end of the second resistor combination being electrically connected with a low voltage, p and q adding up to M which is a positive integer larger than or equal to 3;
    N buttons individually connected in parallel with at least a resistor; and
    an output node whose voltage corresponds to states of the buttons, disposed between the first resistor combination and the second resistor combination for outputting an analog signal.

2. The electronic device according to claim 1, wherein the electronic device further comprises:
    an analog-to-digital converter electrically connected to the output node for converting the analog signal and outputting a digital signal; and
    a microprocessor electrically connected to the analog-to-digital converter, for processing and executing the digital signal.

3. The electronic device according to claim 1, wherein p and q are positive integers larger than or equal to 1.

4. The electronic device according to claim 1, wherein the first resistor combination includes a first resistor, the second resistor combination includes a second resistor and a third resistor, and the second resistor and the third resistor are different.

5. The electronic device according to claim 1, wherein p and q are positive integers larger than 1 and equal to each other.

6. The electronic device according to claim 5, wherein the first resistor combination includes a first resistor and a fourth resistor, the second resistor combination includes a second resistor and a third resistor, the first resistor is connected to the first end of the first resistor combination, the second resistor is connected to the third end of the second resistor combination, the first resistor the second resistor are the same, and the third resistor and the fourth resistor are the same.

7. The electronic device according to claim 1, wherein the first resistor combination comprises at least three resistors and a resistance sum of any two resistors in first resistor combination is unequal to a resistance of any of the remaining resistor.

8. The electronic device according to claim 7, wherein all resistance of the resistors in the first resistor combination form a first geometric series.

9. The electronic device according to claim 8, wherein a first ratio of the first geometric series is 2.

10. The electronic device according to claim 1, wherein the second resistor combination comprises at least three resistors and a resistance sum of any two resistors in second resistor combination is unequal to a resistance of any of the remaining resistors.

11. The electronic device according to claim 10, wherein all resistance of the resistors in the second resistor combination form a second geometric series.

12. The electronic device according to claim 11, wherein a second ratio of the second geometric series is 2.

13. The electronic device according to claim 1, wherein M is equal to N.

* * * * *